(12) United States Patent
Shikata

(10) Patent No.: US 6,340,836 B1
(45) Date of Patent: Jan. 22, 2002

(54) SEMICONDUCTOR DEVICE FOR RECTIFYING

(75) Inventor: Hideaki Shikata, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 09/559,470

(22) Filed: Apr. 26, 2000

(30) Foreign Application Priority Data

Apr. 26, 1999 (JP) .......................................... 11-118715

(51) Int. Cl.⁷ ................................................ H01L 29/00
(52) U.S. Cl. ...................................... 257/544; 257/481
(58) Field of Search .......................... 257/544, 471–474, 257/481–484

(56) References Cited

U.S. PATENT DOCUMENTS 6,078,090 A * 6/2000 Williams et al. ............ 257/476
6,175,143 B1 * 1/2001 Fujihara et al. ............. 257/471

* cited by examiner

Primary Examiner—David Nelms
Assistant Examiner—David Vu
(74) Attorney, Agent, or Firm—Arent Fox Kintner Plotkin & Kahn, PLLC

(57) ABSTRACT

A low impurity concentration semiconductor layer (2) of $n^-$-type is formed by epitaxial growth method on a high impurity concentration semiconductor substrate (1) of $n^+$-type. A plurality of $p^+$-type semiconductor regions (6) are formed in the surface side of the semiconductor layer (2). On the surface of the semiconductor layer and $p^+$-type semiconductor regions, a metal layer (3) is provided to form Schottky barrier with the semiconductor layer (2). Further, $p^+$-type semiconductor regions are arranged regularly so that the plan configuration of each of the semiconductor regions on the surface side of $n^-$-type semiconductor layer is a circularity or a polygon, and that the furthest portion of the plan configulation neighbors or overlaps with immediate adjacent ones, or so that the ratio of the total area of the semiconductor regions (6) to the other portion except for the regions is (2 to 6):1. As a result, in a transient condition when operation is off, the minority carriers remaining in the semiconductor layer can be made to disappear. Consequently, a semiconductor device for rectifying having pn junction is obtained with the characteristic of fast switching speed keeping high withstand voltage.

9 Claims, 6 Drawing Sheets

SEMICONDUCTOR DEVICE FOR RECTIFYING

FIELD OF THE INVENTION

The present invention relates to a semiconductor device for rectifying aimed for high withstand voltage including principally a pn junction. More specifically, the present invention relates to a semiconductor device for rectifying for making forward voltage drop small as well as making switching speed (reverse recovery time, Trr) fast, still maintaining high withstand voltage.

BACKGROUND OF THE INVENTION

The conventional semiconductor devices for rectifying are classified into the pn junction structure type and the Schottky barrier structure type (hereinafter referred to as SBD). The pn junction type one has characteristics in which although forward voltage drop is large, the structure is hard to be broken also against the reverse direction high voltage, so, consequently, this type is used for high withstand voltage use. The SBD type one has characteristics in which although this type is not suitable for high withstand voltage use, particularly forward voltage drop is small as well as switching time Trr is fast, so, this type is used effectively for also high frequency circuits and so on.

The conventional diode for rectifying including a pn junction structure is constructed as shown in, for example, FIG. 8. Referring to FIG. 8, reference numeral 21 denotes an n$^+$-type semiconductor substrate, on which an n$^-$-type epitaxial growth layer 22 is formed to a thickness of, for example, approximately 50 micrometers; and p$^+$-type diffusion region 23 is provided into the surface portion of the epitaxial growth layer 22, to a depth of, for example, approximately 20 micrometers forming a pn junction with the epitaxial growth layer 22. Around the pn junction, p-type FLRs 24 are provided for improving high withstand voltage in the transverse direction. For such use in which the withstand voltage is greater than, for example, approximately 500 volts, in the semiconductor device for rectifying including a pn junction structure, the thickness d of the epitaxial growth layer 22 in the bottom portion of the p$^+$-type diffusion region 23 is formed to be thicker so that the thickness d is greater than 50 micrometers. Reference numeral 125 denotes an insulator film, 26 and 27 denote a p-side electrode and an n-side electrode, respectively, each made of Ag, Al or the like.

In this semiconductor device for rectifying including a pn junction type, when operation is made to be off (that is, the applied voltage is in the reverse direction), unless positive holes, which are minority carriers injected in the n$^-$-type epitaxial growth layer 22, disappear immediately, electric current flow does not become zero and then the switching speed becomes slow. For the reason mentioned above, in the conventional art, a countermeasure is adopted in which a heavy metallic material such as, for example, Au or the like is diffused in advance in the epitaxial growth layer 22 so that minority carriers can be trapped easily to make the switching speed fast. As shown in FIG. 9, diffusing a heavy metallic material is preferable because the smaller the switching speed Trr is made to be when the more doping amount is increased. However, since electric resistance in the epitaxial growth layer 22 is more increased, when such a heavy metallic material is diffused, as shown in FIG. 9, when the more doping amount of such a heavy metal is increased, the larger forward voltage drop V$_F$ becomes and the doping amount is in trade off relation with switching speed.

Therefore, switching speed Trr can not be made to be sufficiently fast. In addition, although not illustrated, the more doping amount of a heavy metal is increased, the more leakage of electric current is increased.

On the other hand, for the purpose of improving withstand voltage in the SBD structure, as disclosed in Japanese Patent Publication Tokko-Sho59-35183 or as shown in FIG. 10($a$), there proposed a structure in which a p$^+$-type region 28 is formed in an island like shape or a stripe shape in the n$^-$-type epitaxial growth layer 22, and a depletion layer formed in the epitaxial growth layer side sandwiched between the p$^+$-type regions 28 reduces the reverse direction leakage current, so that the withstand voltage is enhanced. However, in this structure, the principal part of the structure is the Schottky barrier junction and then the area of the SBD portion is more than half of the layer. In addition, in FIG. 10($a$), an identical portion is referred as the same reference numeral in FIG. 8. Reference numeral 29 denotes an electrode forming Schottky junction between the epitaxial growth layer and the electrode itself.

In addition, as disclosed in, for example, Japanese Published Unexamined Patent Publication Tokkai-Hei7-226521, there proposed a structure in which both a Schottky junction and a pn junction are arranged in parallel in the semiconductor body so that the each preferable characteristics is incorporated simultaneously thereto with the ratio of each being nearly the same; the surface side of the p$^-$-type region is made to be p$^+$-type region so that the amount of the carrier injection to the underside of the Schottky barrier junction is made to be increased; and minority carriers remaining in n$^-$-type region are made to disappear rapidly. Further, the ratio, which is disclosed in the above publication, between the Schottky junction and the pn junction is exemplified as follows: W$_P$ representing the width of the pn junction to be 15 micrometers and W$_N$ representing the width of the Schottky barrier portion to be 5 micrometers (W$_P$:W$_N$=3:1); as shown in FIG. 10($b$), the ratio of the area Q of Schottky barrier portion to the area P of the pn juntion portion is as follows: {13×13−3×3×9(pieces)}:{3×3×9(pieces)}=88:81= 1.09:1; and the ratio of each region nearly equals to each other.

As mentioned above, for the purpose of enhancing withstand voltage in Schottky barrier semiconductor device, the structure in which a pn junction is provided in an island like shape or a stripe shape in semiconductor layers where Schottky junction is provided, so that both a Schottky junction and a pn junction are arranged in parallel is wellknown. However, for the purpose of obtaining a semiconductor device for rectifying, especially for super high withstand voltage, for example, from not less than 200 volts to approximately 1700 volts, unless making the thickness d of the epitaxial layer shown in FIG. 8 or FIG. 10 to be thicker, sufficient withstand voltage cannot be obtained. If the distance d is large, series resistance in the SBD portion becomes large and the influence upon forward voltage drop becomes remarkable. Thus, there arises a problem where a semiconductor device for rectifying aimed for high withstand voltage in which forward voltage drop is made to be small and switching time is made to be fast is not obtained.

SUMMARY OF THE INVENTION

The present invention is achieved in order to solve the above mentioned problem. The purpose of the present invention is to provide a semiconductor device for rectifying having pn junction in which high withstand voltage is still maintained and, further, switching speed is fast through making minority carriers remaining in semiconductor layers disappear immediately in the transient period in which operation is made to be off(forward direction potential is changed to reverse direction potential).

The semiconductor device for rectifying of the present invention comprises: a semiconductor substrate of a first conductivity type with a high impurity concentration;

a semiconductor layer of the first conductivity type with a low impurity concentration formed by epitaxial growth on the semiconductor substrate;

a plurality of semiconductor regions of a second conductivity type formed in a surface side of the semiconductor layer; and a metal layer formed on a surface of the semiconductor layer and on a surface of the semiconductor regions, the metal layer forming a Schottky barrier with the semiconductor layer, wherein the semiconductor regions are formed to be regularly arranged in such a manner that a plan configuration of each of the semiconductor regions on a surface of the semiconductor layer is a circularity or a polygon, and that a portion which is the furthest from a center portion of the circularity or polygon neighbors or overlaps with the circularity or polygon of an immediate adjacent semiconductor region.

Hereinafter, expression "circularity" or "polygon" shape includes not only a perfect circularity or a quadrilateral but a shape including a straight portion and arc portion, or an ellipse shape or the like; expression "polygon" shape means that the number of angles is not less than four. In addition, a portion which is the furthest from the center portion (the furthest portion) means a portion on a rim in the case of a circularity and means a corner portion in the case of a polygon. Further, in expression "neighbor or overlap" means that it is not necessary that the furthest portions of both two immediate adjacent semiconductor regions neighbor or overlap each other, but the following case is also included: the furthest portion of one of the semiconductor region neighbors or overlaps with the other portion except for the furthest portion of the other semiconductor region.

Adoption of such structure allows to form a rectifying device for high withstand voltage having a pn junction, because the metal layer is contacted in the second conductivity semiconductor regions with an ohmic contact. Specifically, around the second conductivity type semiconductor regions, a first conductivity type semiconductor layer lies in a position which is apart nearly equivalent distance from the center portion, and Schottky junction is formed between the first conductivity type semiconductor layer and the metal layer. In this Schottky junction, movement of electrons only is carried out, but movement of holes is not carried out. Thus, when operation is changed to the reverse direction, even in a case where the minority carriers(holes) exist in the first conductivity type semiconductor layer, electrons can act so that the minority carriers (positive holes) become to disappear. As the result, switching speed can be made to be fast. Furthermore, the Schottky junction is required to have only electrons supplying function for supplying electrons to the semiconductor layer around the pn junction in order to make the minority carriers (holes) disappear when operation is off, and the Schottky junction portion is not required to have a function as a Schottky diode, and the Schottky junction may be provided around the second conductivity type regions. Therefore, the Schottky junction can be constructed with sufficiently small area, so there is not arising the forward voltage drop, even in a case where the first conductivity type semiconductor layer is thick by being used for high withstand voltage.

When the semiconductor regions are formed to be arranged so that a total area of the semiconductor regions on a surface of the semiconductor layer is between not less than two times and not more than six times an area of remaining surface of the semiconductor layer on which the semiconductor regions are not formed, the minority carriers are made to disappear without making the forward voltage drop large. Such division into the above mentioned ratio of area can provide similar advantages, even in a case where the shape of the semiconductor regions is not the same as the above mentioned shape.

Specifically, the semiconductor regions are formed so that a plan configuration of each of the semiconductor regions on a surface of the semiconductor layer is a circularity, and that periphery portions of the circularity of each of immediate adjacent semiconductor regions are in contact each other; alternatively, the semiconductor regions are formed so that a plan configuration of each of the semiconductor regions on a surface of the semiconductor layer is a circularity, and that periphery portions of the circularity of each of immediate adjacent semiconductor regions overlap each other; alternatively, the semiconductor regions are formed so that a plan configuration of each of the semiconductor regions on a surface of the semiconductor layer is a rhombus, and that corner portions of the rhombus of each of immediate adjacent semiconductor regions overlap each other; alternatively, the semiconductor regions are formed so that a plan configuration of each of the semiconductor regions on a surface of the semiconductor layer is an octagon, and that corner portions of the octagon of each of immediate adjacent semiconductor regions overlap each other; alternatively, the semiconductor regions are formed to be regurally arranged so that a plan configuration of each of the semiconductor regions on a surface of the semiconductor layer is a hexagon and the hexagon of each of the arranged semiconductor regions is rotated by 90 degrees in order, and that a corner portion and one side portion of the hexagon of each of immediate adjacent semiconductor regions overlap each other.

When a thickness of the semiconductor layer formed by epitaxial growth is not less than 20 micrometers, a withstand voltage for not less than 200 volts can be obtained without bringing influence of the forward voltage drop.

DETAILED DESCRIPTION

Figure 1:
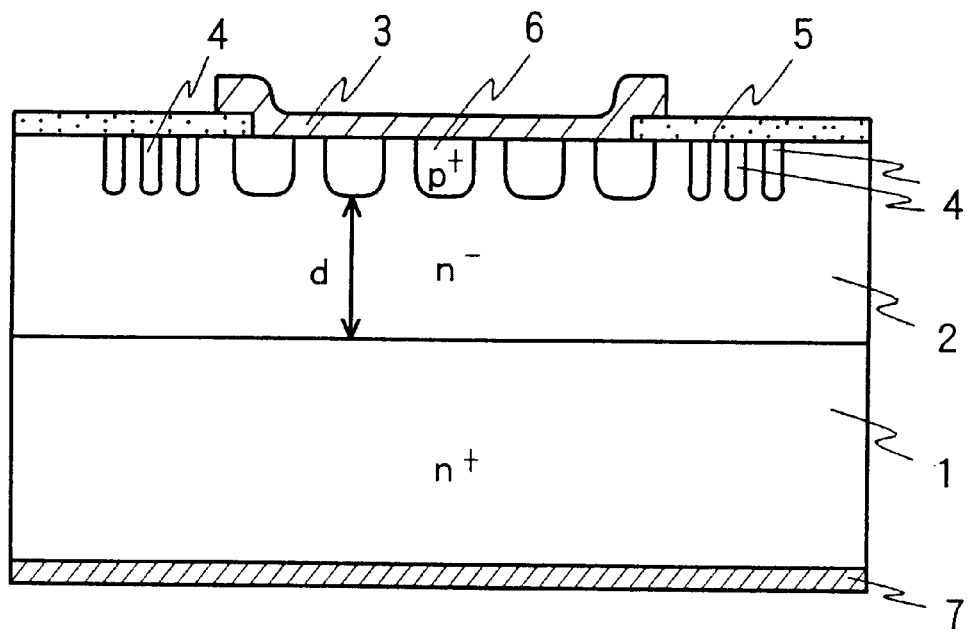
FIGS. 1(a) and 1(b) are schematic views each illustrating one embodiment of the semiconductor device for rectifying in accordance with the present invention.
Figure 1:
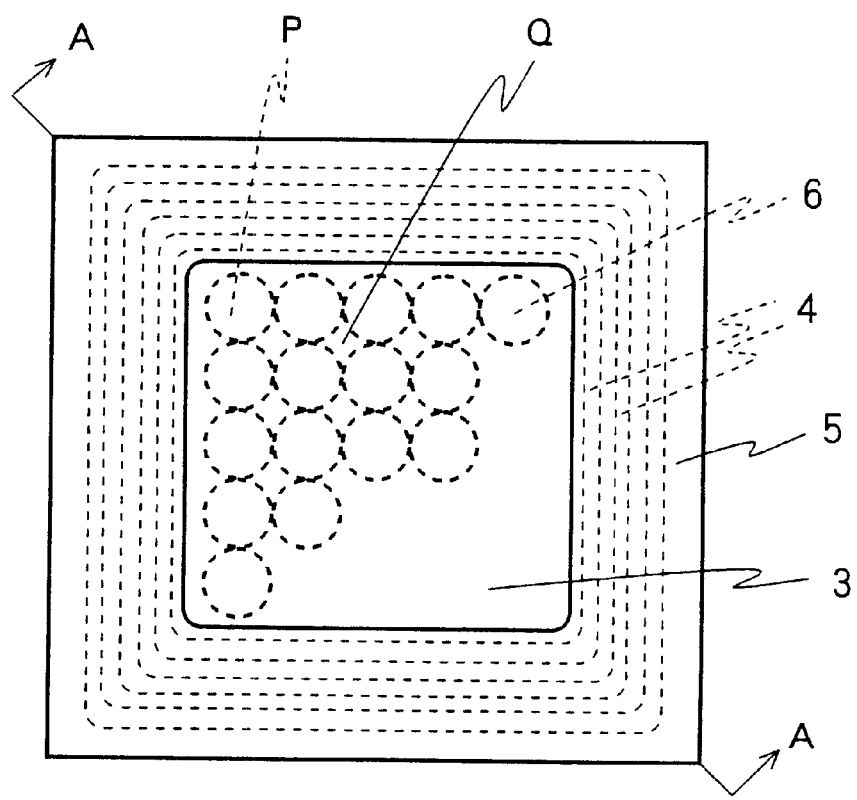

As shown in FIG. 1(a) in which the cross-sectional view of one embodiment of the present invention is illustrated, the semiconductor device for rectifying in accordance with the present invention includes a first conductivity type, for example, n$^+$-type, high impurity concentration semiconductor substrate 1, on which a first conductivity type, which is n$^-$-type, low impurity concentration semiconductor layer 2 formed by epitaxial growth method is provided; a plurality of second conductivity type, p$^+$-type, semiconductor regions 6 are formed in the upper surface side portion of the semiconductor layer 2; on the external surface of the semiconductor layer 2 and on the surface of the p$^+$-type semiconductor regions 6, a metal layer 3 is provided to form a Schottky barrier with the semiconductor layer 2. Further, p$^+$-type semiconductor regions 6 are formed into the upper surface side portion of the n$^-$-type semiconductor layer 2 in such a manner that the plan configuration of each of the surface side of the regions 6 is a circularity or a polygon like shape, and that each portion, which is the furthest portion from the center of the regions 6, as shown in FIG. 1(b) illustrating the plan configuration thereof, is formed to be arranged regularly either in such a manner that the furthest portion from the central portion neighbors or overlaps with the immediate adjacent p$^+$-type semiconductor regions 6.

The semiconductor substrate 1 is made of n$^+$-type silicon and the impurity concentration is, for example, approximately $1 \times 10^{19}$ cm$^{-3}$; and the thickness is, for example, approximately 200 to 250 micrometers. The semiconductor layer 2 provided on the semiconductor substrate 1 is made of n$^-$-type silicon semiconductor layer by epitaxial growth method with the impurity concentration being, for example, approximately $1 \times 10^{15}$ cm$^{31\ 3}$ and the thickness being, for example, approximately 20 to 100 micrometers. Since when the sicker the semiconductor layer 2 is formed, the higher withstand voltage can be obtained, the semiconductor layer 2 is formed to a thickness such that a desirable withstand voltage can be obtained. Then, for example, the semiconductor layer 2 should be grown to a thickness as follows: for the purpose of obtaining 200 volts withstand voltage, the thickness should be greater than 20 micrometers, for example, approximately 25 micrometers; for the purpose of obtaining 400 volts withstand voltage, the thickness should be 50 micrometers; for the purpose of obtaining 600 volts withstand voltage, the thickness should be, for example, approximately 60 micrometers; and for the purpose of obtaining 1500 volts withstand voltage, the thickness should be 100 micrometers.

As shown in FIG. 1(b) in which the plan view of the embodiment is illustrated, on the surface of the semiconductor layer 2, p$^+$-type semiconductor regions 6 are formed through diffusion method with the plan configuration of each of the regions being, for example, a circularity and each region being arranged in a matrix manner. The dimension of each of the p$^+$-type semiconductor regions 6 is formed in such a manner that the diameter is formed to be, for example, approximately 20 to 100 micrometers; and the depth is approximately 10 to 50 micrometers. In the example shown in FIGS. 1(a) and 1(b), p$^+$-type semiconductor regions 6 are arranged in a matrix manner so that the immediate adjacent two semiconductor regions 6 are in contact each other; otherwise, or they may be arranged so that the immediate adjacent two semiconductor regions 6 overlaps each other. The reason that the p$^+$-type semiconductor regions 6 are formed in such a manner that the plan configuration of each of the regions 6 is made to be a circularity is because the periphery of the semiconductor regions 6 may be encircled as much as possible by the semiconductor layer 2 and that positive holes remaining in the semiconductor layer 2 as minority carriers can be made to disappear easily by supplying electrons from the Schottky junction to n$^-$-type semiconductor layer 2 when forward voltage application is made to be off through a switching mechanism discussed later.

Specifically, when forward voltage is applied, the electric current flows through the pn junction in such a manner that electrons are injected into p$^+$-type semiconductor regions 6 and that also positive holes are caused to be moved from p$^+$-type semiconductor regions 6 into n$^-$-type semiconductor layer 2. When forward voltage is made to be off, since some holes are still remaining in the low impurity concentration n$^{31}$ -type semiconductor layer 2, electric current still continues to flow and does not become zero immediately even in the case where operation is off. The remaining holes will be made to disappear as soon as possible through recombining the holes with the electrons collected in the Schottky junction. (In such Schottky junction, electrons only move but holes do not move.) Thus, it is preferable that the semiconductor regions 6 are formed in such a manner that each point of the outer shape of the p$^+$-type semiconductor regions 6 is by approximately equal distance apart from the central portion so that this n -type semiconductor layer 2 is provided to be uniformly located around the periphery of the pn junction.

The portion of the semiconductor layer 2 sandwiched between the semiconductor regions 6 is provided to form a Schottky junction with metal layer 3 provided in the surface portion of the semiconductor layer 2 to be formed an SBD. As mentioned above, although the semiconductor layer 2 makes the minority carriers remaining in the semiconductor layer 2 disappear immediately by supplying electrons when the operation switchs off, and the region rectifies as SBD when switch is not made to be off (The forward voltage is applied). But in the SBD portion, since the portion defined from the surface of the semiconductor layer 2 to the n +-type semiconductor substrate 1 is an operation region, the thickness of the semiconductor layer 2, in which the impurity concentration is low, should be thicker for the high withstand voltage and the series resistance acts with more influence. Particularly, forward voltage drop becomes large with increasing the thickness of the semiconductor layer 2 for high withstand voltage use. Accordingly, if the total area Q of the semiconductor layer 2 sandwiched between the semiconductor region 6 is too large, the semiconductor device serves as a semiconductor device for rectifying in which SBD principally operates and the forward voltage drop becomes large. If the forward voltage drop is intended to be made to be small, the withstand voltage will be down since the thickness of the semiconductor layer 2 must be thinner. Accordingly, the area of the SBD portion cannot be made to be too large.

Figure 2:
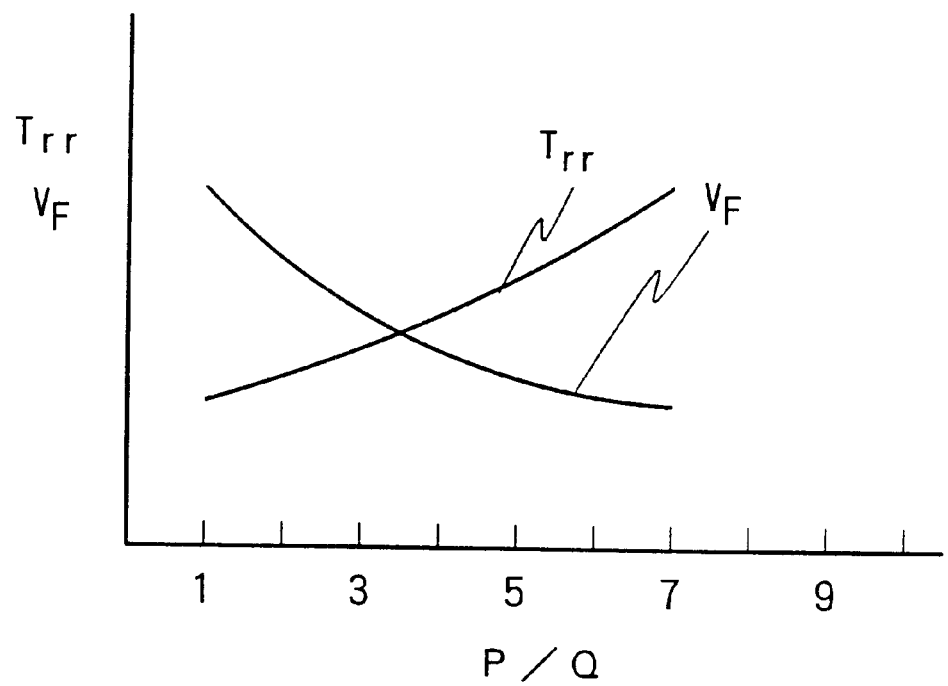
FIG. 2 is a diagram illustrating the relationship between the switching speed relating to a ratio of a total area of $p^+$-type semiconductor regions to a total area of $n^-$-type semiconductor layer sandwiched between the semiconductor regions in the structure shown in FIGS. 1(a) and 1(b)

The present inventor investigated the relationship between switching speed Trr and forward voltage drop $V_F$ with the ratio of the total area P of the $p^+$-type semiconductor regions 6 to the total area Q of the portion of the semiconductor layer 2 being around the $p^+$-type semiconductor regions 6, by varing the ratio, with a semiconductor device for rectifying in which the withstand voltage is approximately 400 volts; the thickness of the semiconductor layer 2 is approximately 50 micrometers; the distance d is approximately 30 micrometers. The characteristic relationship is shown in FIG. 2. With respect to the ratio P/Q, the relationship between Trr and $V_F$ is in trade off relation. In this relationship, the ratio P/Q for satisfying the both ranges preferably approximately 3 to 4. Further, the present inventor also found that if the withstand voltage is required to be higher, the thickness of the semiconductor layer 2 will also be made to be thicker and the ratio of the area Q should be smaller; on the other hand, if the withstand voltage is made to be lower, the ratio of the area Q can be made to be larger. In a semiconductor device for rectifying for obtaining withstand voltage ranging from approximately 200 volts to 1700 volts, the ratio P/Q is preferably two to six times, further preferably three to four times, then switching speed can be made fast without making the amount of the withstand voltage drop large.

Figure 3:
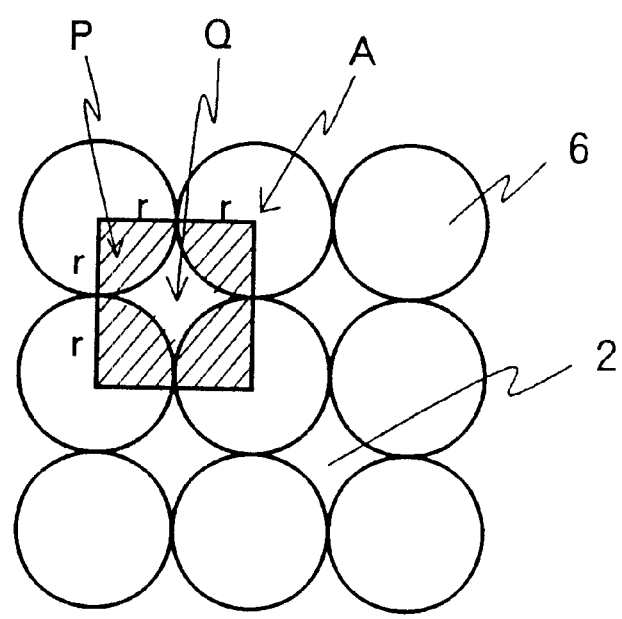
FIG. 3 is a schematic view illustrating a method for obtaining a ratio P/Q of an area of the $p^+$-type semiconductor region to an area of n -type semiconductor layer sandwiched between the semiconductor regionsin the structure shown in FIGS. 1(a) and 1(b)

For example, as shown in FIG. 1(b), when the ratio P/Q is determined in a case where semiconductor regions 6, the plan configuration of which is a circular shape, are arranged so that just the periphery of each of the semiconductor regions 6 is in contact with an immediate adjacent region. As a portion A including the region surrounding the semiconductor layer 2 having the area Q is illustrated as one unit in enlarged dimension in FIG. 3, the area P of the semiconductor regions 6 equals just to four quarters of the circular; that is, $P=\pi r^2$.

Besides, the area Q of the portion of the semiconductor layer 2 surrounded by semiconductor regions 6 is as follows:
$Q=(2r)^2-\pi r^2=(4-\pi)r^2=0.86r^2$.
Accordingly, $P/Q=3.14/0.86=3.65$ As mentioned above, it is sufficient that the portion surrounded by the $p^+$-type semiconductor regions 6 is formed so that the area is not large and the position is as close as possible to the periphery of the pn junction (including the bottom side of the junction) formed between $p^+$-type semiconductor regions 6 and semiconductor layer 2. Accordingly, for the reason mentioned above, although the plan configuration of each of the semiconductor regions 6 is not necessarily designed to be a circularity, but a shape in which each point of the outward form is as nearly equivalent distant as possible from the center of the shape is preferable. Various shapes such as shown in FIG. 4(a) to FIG. 4(d) may be formed in various arrangements.

Figure 4A:
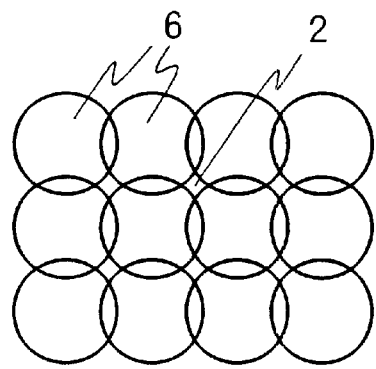
FIGS. 4(a) to 4(d) are schematic views each illustrating the other examples of the plan configuration of the $p^+$-type semiconductor region.

The plan configuration illustrated in FIG. 4(a) is based on a pattern in which $p^+$-type semiconductor regions 6, each of which has a circular plan configuration, are arranged periodically in such a manner that the rims of the circularity of each of immediate adjacent semiconductor regions 6 overlap each other. Through such an arrangement in which each shape overlaps each other, the larger ratio of P/Q can be obtained. Accordingly, when the thickness of the semiconductor layer 2 is made to be thicker and the series resistance is larger for high withstand voltage use, the advantage is obtained effectively.

Figure 4B:
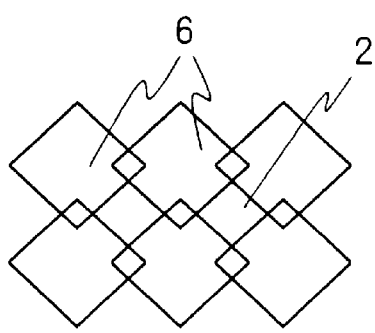

The plan configuration illustrated in FIG. 4(b) is a "rhombus" shape pattern in which semiconductor regions 6 are arranged periodically in such a manner that the corner portions of the rhombus of each of immediate adjacent semiconductor regions overlap each other. Through such an arrangement with the corner portions overlapped, even in the case of a rectangular shape, since the semiconductor regions 6 are surrounded approximately equal distance from the center by semiconductor layer 2, remaining minority carriers can be made to disappear immediately by supplying electrons from the Schottky junction when switching off is carried out.

Figure 4C:
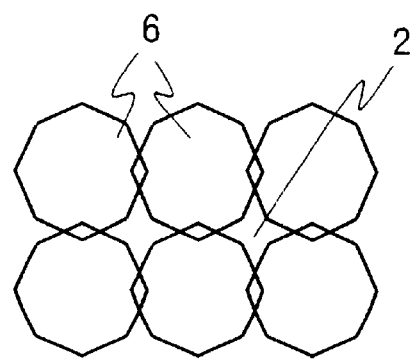

The plan configuration illustrated in FIG. 4(c) is a regular octagon pattern in which a corner portion overlaps with the immediate adjacent corner portion, thereby obtaining functions approximately equal to the case of a circularity.

Figure 4D:
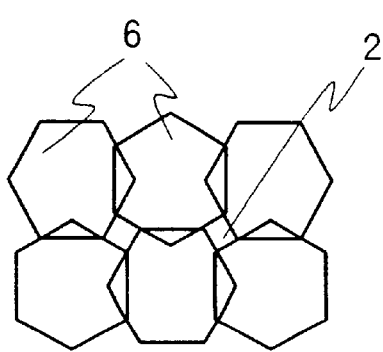

The plan configuration illustrated in FIG. 4(d) is a regular hexagon pattern in which, the hexagon pattern of each of the arranged semiconductor regions 6 is rotated by 90 degree in order, and one corner portion of the hexagon overlaps with the side portion of the immediate adjacent semiconductor region 6. Thus, even in the case where the furthest portions (corner portions) do not overlap each other, such an arrangement in which similar shapes are formed repeatedly can obtain equal functions and advantages.

The shape of the plan configuration of the semiconductor regions 6 are not restricted to the above embodiments, and it may be selected from a group consisting of other polygon, or other shapes based on combination of arc and angle.

The metal layer 3 is formed an electrode for one side by forming a film and patterning through vapor evaporation or sputtering by using a metallic material, for example, Ti or Mo or the like, suitable for forming a Schottky barrier (Schottky junction) with $n^-$-type semiconductor layer 2. When the electrode is provided on the $p^+$-type semiconductor region 6, since conductivity type is $p^+$-type and that the impurity concentration is high, the electrode operates as a usual electrode keeping ohmic contact with $p^+$-type semiconductor regions 6. The portion of the metal layer been in contact with the semiconductor layer 2 directly forms a Schottky junction, and the portion forms SBD between the metal layer 3 and the semiconductor layer 2. As mentioned above, the ratio of the SBD portion is small, accordingly, such SBD portion does not much influence to forward voltage drop $V_F$. And, on the reverse side of the semiconductor substrate 1 an electrode 7 made of Ni, Au or the like is formed.

An FLR 4 represents a so-called field limiting ring. The FLR 4 is provided in order to improve withstand voltage in transverse direction through enlarging the depletion layer formed in a pn junction toward the outside of the FLR 4. When $p^+$-type semiconductor regions 6 are formed, this FLR 4 is simultaneously by diffusing the same p-type impurity. In FIG. 1(a), FLRs 4 including three rings arranged concentrically are illustrated as an example. In reality, the more the rings are provided, the higher withstand voltage can be obtained. Thus, a desired number of the rings of FLR 4 can be provided depending on the desired withstand voltage.

Hereinafter, the manufacturing method for the Schottky barrier semiconductor device illustrated in FIGS. 1(a) and 1(b) will be discussed.

Firstly, $n^+$-type silicon semiconductor layer in which the impurity concentration is, for example, approximately $1\times10^{15}$ cm$^{-3}$ is grown epitaxially to the thickness of approximately 10 to 50 micrometers on the surface of the n+-type semiconductor substrate in which the impurity concentration is, for example, approximately $1 \times 10^{19}$ cm$^{-3}$. Next, an insulator film made of SiO$_2$ or the like is provided on the surface of the semiconductor layer 2 through CVD method or the like; a mask with openings each position of which is corresponding to only the position where the second conductivity type semiconductor regions 6 are provided; an impurity such as boron (B) or the like is implanted and diffused into the semiconductor layer 2, then p+-type semiconductor regions 6 are provided to the depth of approximately 10 to 20 micrometers and the diameter of approximately 40 micrometers φ. In the above mentioned process, if a p+-type impurity is implanted to regions for providing FLRs 4 simultaneously, FLRs 4 can be formed simultaneously. The plan configuration of the semiconductor regions 6 can be arbitrarily formed depending on the above mentioned mask shape.

After that, an oxide film 5 is formed on the surface of the semiconductor layer 2 so that the portions of the p+-type semiconductor regions 6 are exposed (as shown in FIG. 1(a)); a metallic material, for example, Ti or Mo, capable for forming a Schottky barrier with n−-type semiconductor layer 2 is formed by sputtering method on the whole surface to approximately 2 to 4 micrometers thick and patterned to obtain the metal layer 3; and electrode 7 made of a metallic material such as Ni, Au, or the like is formed also on the reverse side of the semiconductor layer 1 by sputtering method or the like. Thus, the semiconductor device for a rectifier including a structure shown in FIG. 1(a) and 1(b).

Figure 5:
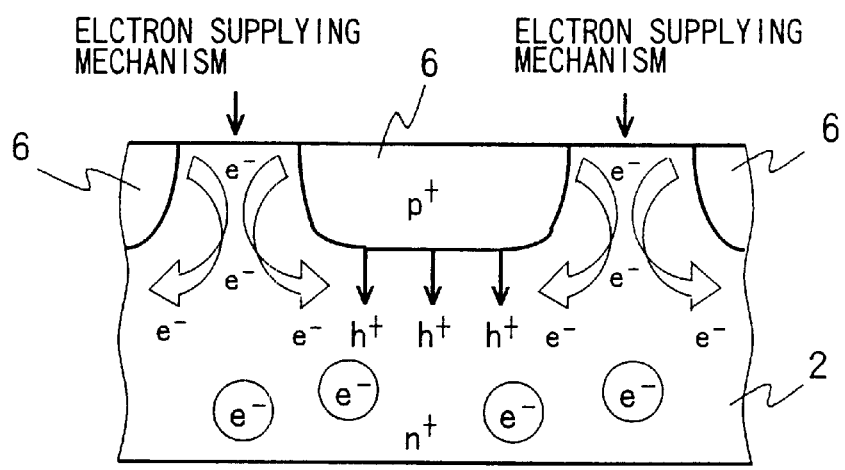
FIG. 5 is a schematic view illustrating a function of the semiconductor device for rectifying shown in FIG. 1(a) and 1(b)

Next, the function of the semiconductor device for rectifying in accordance with the present invention is explained. FIG. 5 illustrates the enlarged cross-sectional view of one of the p+-type semiconductor regions 6 portion shown in FIG. 1. When operation is made to be off (the reverse voltage is applied), since the holes h+ injected to the n−-type semiconductor layer 2 from the p+-type semiconductor regions 6 can not move to anywhere in n−-type semiconductor layer 2. And some of the holes become to disappear gradually by being trapped by electrons e− in n−-type semiconductor layer 2 or by being combined with electrons e− in n−-type semiconductor layer 2. When the number of the electrons to be trapped is a few, such holes hardly disappear, and switching speed becomes slow.

However, in the present invention, the SBD is formed around the respective p+-type semiconductor regions 6. In this SBD, direct movement of the electrons generates current flow, injection of holes is not carried out. Thus, since electrons are collected around the Schottky barrier while operating. In turn, when operation is made to be turned off, electrons become to be stationary with the state being collected around the SBD portion. These electrons become to move toward the hole side to combine the remaining holes which are injected from the pn junction and can not move anywhere when operation is of f. Thus, these electrons can trap the holes to make the hole disappear easily. As the result, such electrons can make the holes disappear which are minority carriers to stop current flow at once and then switching can be performed. That is the SBD portion operates as an electron supplying mechanism. For the reason mentioned above, such an electron supplying mechanism is required only to supply electrons to the neighborhood of the pn junction. Conseqently, as mentioned above, much smaller area than that of p+-type semiconductor regions 6 is sufficient for supplying electrons to the neighborhood of the pn junction. Therefore, the function as SBD is hardly noticeable. As the result, even when the semiconductor layer 2 in which the impurity concentration is low is formed to be thicker for high withstand voltage, forward voltage drop V$_F$ scarcely causes a problem.

Figure 6:
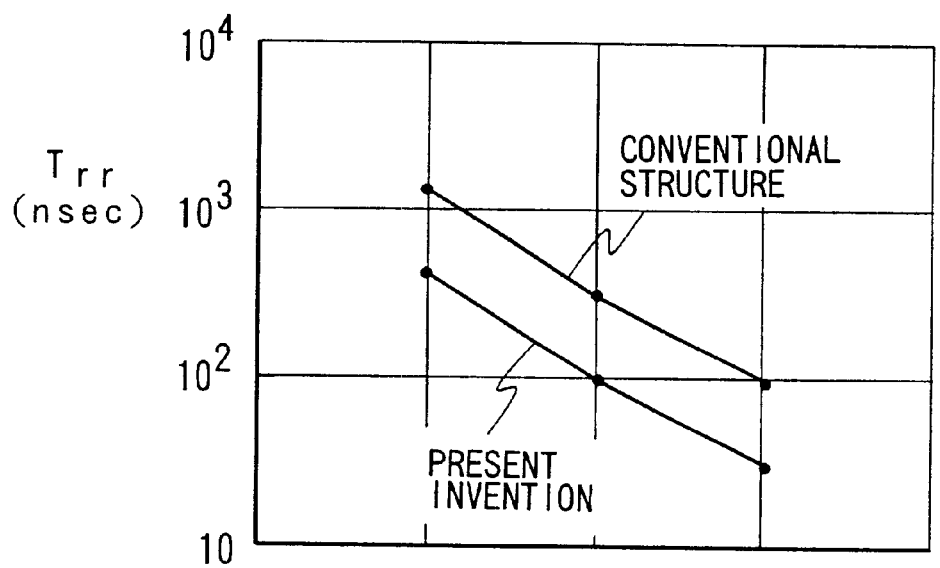
FIG. 6 is a diagram illustrating the relationship of the switching speed Trr to Au doping amount in the structure shown in FIGS. 1(a) and 1(b) in comparison with the characteristics in the conventional structure.
Figure 7:
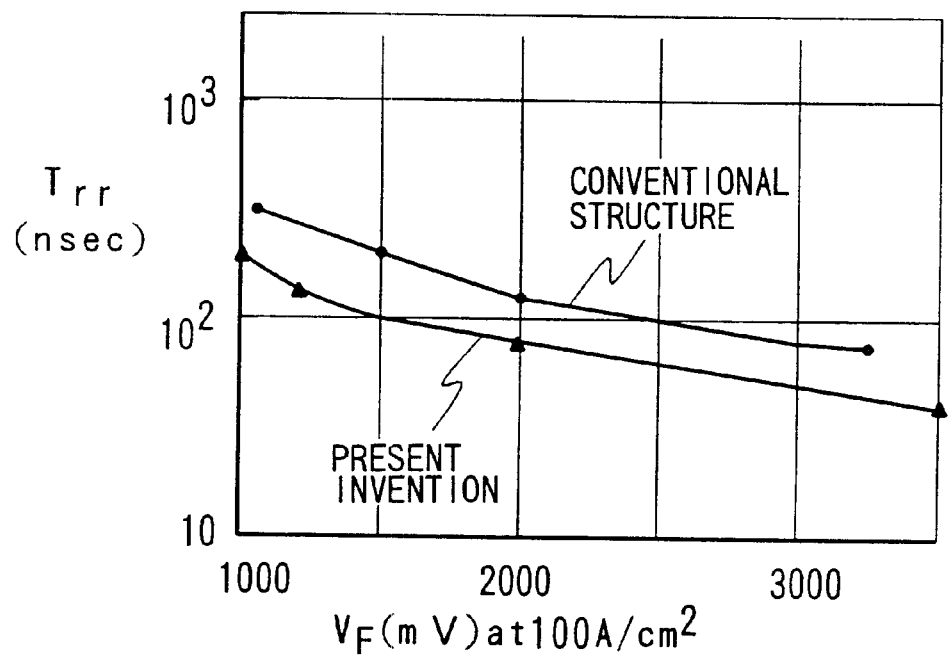
FIG. 7 is a diagram illustrating the relationship of the switching speed Trr to forward voltage drop $V_F$ in the structure shown in FIGS. 1(a) and 1(b) in comparison with the characteristics in the conventional structure.
Figure 8:
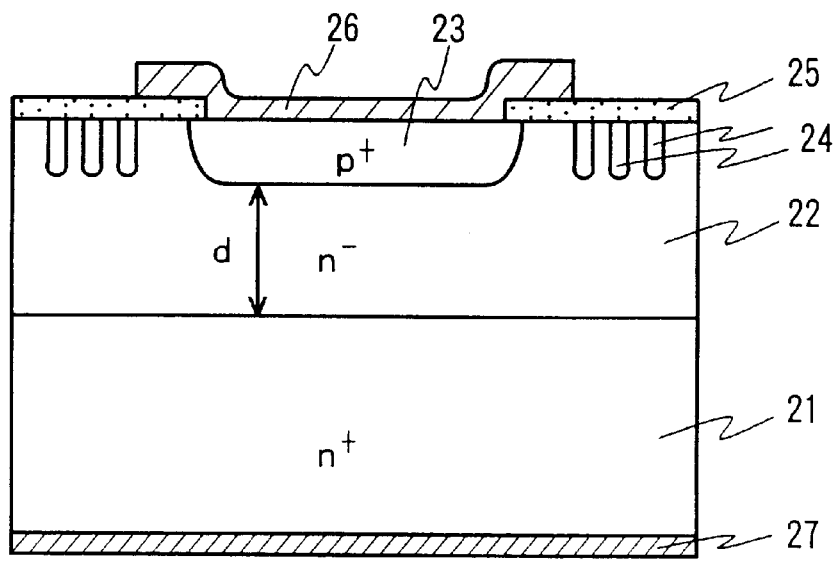
FIG. 8 is a schematic view illustrating one example of the conventional semiconductor device for rectifying.
Figure 9:
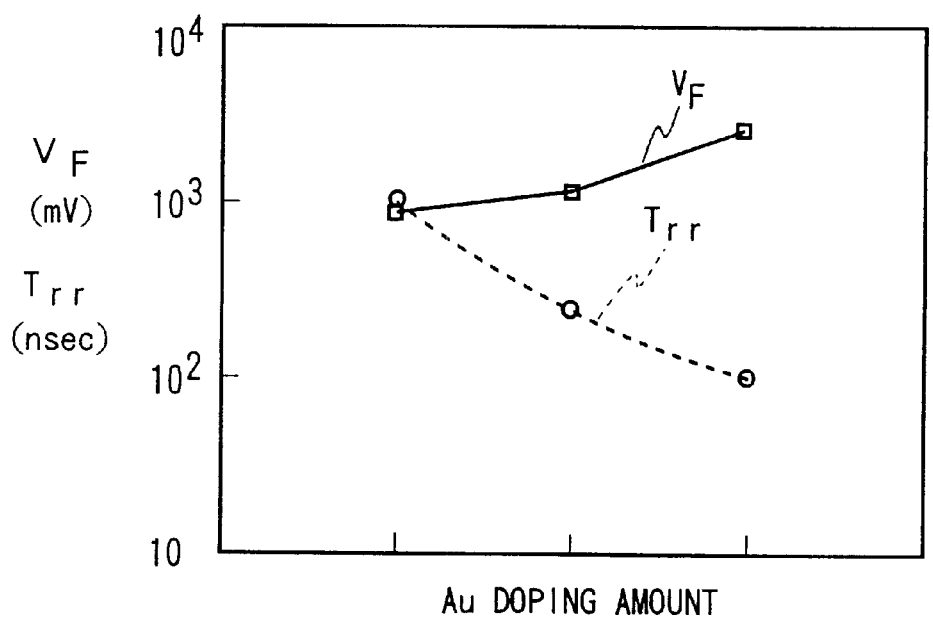
FIG. 9 is a diagram illustrating the relationship of the switching speed Trr and forward voltage drop $V_F$ to Au doping amount in the structure of the conventional semiconductor device for rectifying.
Figure 10A:
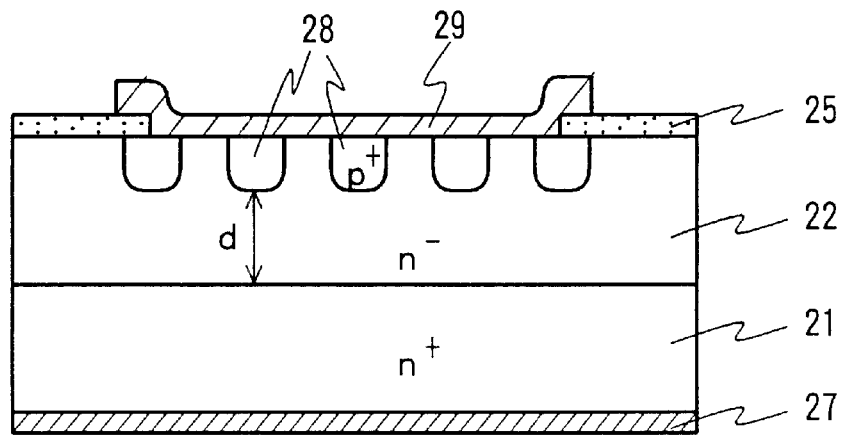
FIGS. 10(a) and 10(b) are schematic views illustrating a cross-sectional view and a top view of the conventional Schottky barrier semiconductor device in which pn junction is provided.
Figure 10B:
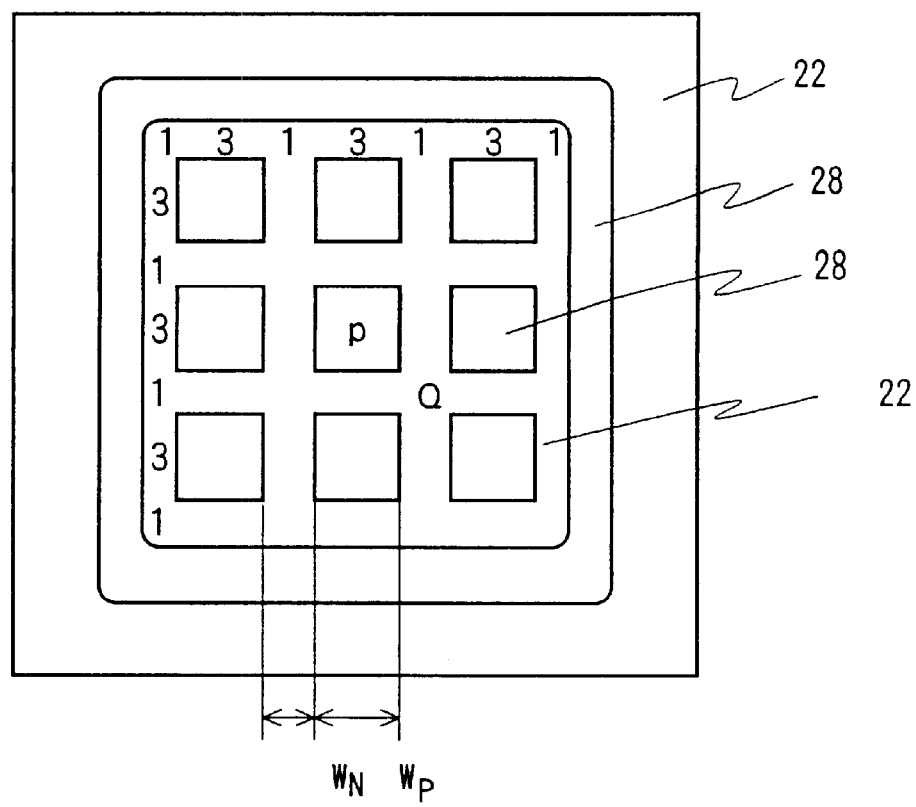

The relationship between the switching speed Trr (nsec) and the doping amount for Au diffusion in the semiconductor device for rectifying having the structure shown in FIGS. 1(a) and 1(b) is illustrated in FIG. 6 in comparison with the characteristics of the conventional structure. Obviously from FIG. 6, the switching speed Trr is approximately ⅓ to the same doping amount for Au diffusion compared with the conventional structure. In addition, forward voltage drop V$_F$ characteristics in accordance with the present invention does not provide any variation. Further, the relationship between the switching speed Trr and the voltage drop V$_F$ (mV) under the condition 100 A/cm$^2$ is similarly illustrated in FIG. 7 in comparison with that of the example of the conventional structure. This schematic view shows apparently that switching time is made to be approximately ½.

As mentioned above, in accordance with the present invention, switching speed can be made to be fast without making forward voltage drop V$_F$ large, while maintaining high withstand voltage characteristics. As the result, since forward voltage drop (forward direction loss)V$_F$ and switching speed Trr are in trade off relation, both requirement are not satisfied simultaneously in conventional countermeasure in which only Au diffusion technique is performed, on the contrary, in the present invention, ultra super high speed semiconductor device for rectifying with very low V$_F$ is obtained.

Although preferred example have been described in some detail it is to be understood that certain changes can be made by those skilled in the art without departing from the spirit and scope of the invention as defined by the appended claims.

What is claimed is:

1. A semiconductor device for rectifying comprising:
   a semiconductor substrate of a first conductivity type with a high impurity concentration;
   a semiconductor layer of said first conductivity type with a low impurity concentration formed by epitaxial growth on said semiconductor substrate;
   a plurality of semiconductor regions of a second conductivity type formed in a surface side of said semiconductor layer; and
   a metal layer formed on a surface of said semiconductor layer and on a surface of said semiconductor regions, said metal layer forming a Schottky barrier with said semiconductor layer;
   wherein said semiconductor regions are formed to be regularly arranged in such a manner that a plan configuration of each of said semiconductor regions on a surface of said semiconductor layer is a circularity or a polygon, and that at least one of said plurality of semiconductor regions contacts or overlaps with at least one other said plurality of semiconductor regions.

2. The semiconductor device for rectifying of claim 1, wherein said semiconductor regions are formed to be arranged so that a total area of said semiconductor regions on a surface of said semiconductor layer is between not less than two times and not more than six times an area of remaining surface of said semiconductor layer on which said semiconductor regions are not formed.

3. The semiconductor device for rectifying of claim 1, wherein said semiconductor regions are formed so that a plan configuration of each of said semiconductor regions on a surface of said semiconductor layer is a rhombus, and that corner portions of said rhombus of each of immediate adjacent semiconductor regions overlap each other.

4. The semiconductor device for rectifying of claim 1, wherein said semiconductor regions are formed so that a plan configuration of each of said semiconductor regions on a surface of said semiconductor layer is an octagon, and that corner portions of said octagon of each of immediate adjacent semiconductor regions overlap each other.

5. The semiconductor device for rectifying of claim 1, wherein said semiconductor regions are formed to be regularly arranged so that a plan configuration of each of said semiconductor regions on a surface of said semiconductor layer is a hexagon and said hexagon of each of said arranged semiconductor regions is rotated by 90 degrees in order, and that a corner portion and one side portion of said hexagon of each of immediate adjacent semiconductor regions overlap each other.

6. The semiconductor device for rectifying of claim 1, wherein a thickness of said semiconductor layer is not less than 20 micrometers.

7. A semiconductor device for rectifying comprising:

a semiconductor substrate of a first conductivity type with a high impurity concentration;

a semiconductor layer of said first conductivity type with a low impurity concentration formed by epitaxial growth on said semiconductor substrate;

a plurality of semiconductor regions of a second conductivity type formed in a surface side of said semiconductor layer; and a metal layer formed on a surface of said semiconductor layer and on a surface of said semiconductor regions, said metal layer forming a Schottky barrier with said semiconductor layer, wherein said semiconductor regions are formed to be arranged so that a total area of said semiconductor regions on a surface of said semiconductor layer is between not less than two times and not more than six times an area of remaining surface of said semiconductor layer on which said semiconductor regions are not formed.

8. The semiconductor device for rectifying of claim 7, wherein a thickness of said semiconductor layer is not less than 20 micrometers.

9. A semiconductor device for rectifying comprising:

a semiconductor substrate of a first conductivity type with a high impurity concentration;

a semiconductor layer of said first conductivity type with a low impurity concentration formed by epitaxial growth on said semiconductor substrate;

a plurality of semiconductor regions of a second conductivity type formed in a surface side of said semiconductor layer; and a metal layer formed on a surface of said semiconductor layer and on a surface of said semiconductor regions, said metal layer forming a Schottky barrier with said semiconductor layer, wherein said semiconductor regions are formed to be regularly arranged in such a manner that a plan configuration of each of said semiconductor regions on a surface of said semiconductor layer is a circularity or a polygon, and that a portion which is the furthest from a center portion of said circularity or polygon neighbors or overlaps with said circularity or polygon of an immediate adjacent semiconductor region, and wherein said semiconductor regions are formed to be arranged so that a total area of said semiconductor regions on a surface of said semiconductor layer is between not less than two times and not more than six times an area of remaining surface of said semiconductor layer on which said semiconductor regions are not formed.

* * * * *